(12) United States Patent
Hofman et al.

(10) Patent No.: US 6,184,045 B1
(45) Date of Patent: Feb. 6, 2001

(54) METHOD FOR DRAM CELL ARRANGEMENT AND METHOD FOR ITS PRODUCTION

(75) Inventors: Franz Hofman, Munich; Lothar Risch, Neubiberg; Wolfgang Roesner, Munich; Wolfgang Krautschneider, Hohenthann, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/541,952

(22) Filed: Apr. 3, 2000

Related U.S. Application Data

(62) Division of application No. 09/228,611, filed on Jan. 12, 1999.

(30) Foreign Application Priority Data

Jan. 12, 1998 (DE) .............................. 198 00 752

(51) Int. Cl.⁷ ..................... H01L 21/8242; H01L 7/06
(52) U.S. Cl. .................. 438/3; 438/238; 438/253
(58) Field of Search ............................. 438/3, 238–256, 438/381–399

(56) References Cited

U.S. PATENT DOCUMENTS

| 4,630,088 | 12/1986 | Ogura et al. |
| 4,974,060 | 11/1990 | Ogasawara . |
| 5,055,898 | 10/1991 | Beilstein, Jr. et al. . |
| 5,270,561 | 12/1993 | Jun . |
| 5,621,606 | 4/1997 | Hwang . |
| 6,080,594 | * 7/2000 | Choi .......................................... 438/3 |
| 6,083,765 | * 7/2000 | Tempel ....................................... 438/3 |

OTHER PUBLICATIONS

A 250mV Bit–Line Swing Scheme for a 1V 4Gb DRAM—Inaba et al—ULSI Research Laboratories, Research and Development Center—1995 Symposium on VLSI Circuits Digest of Technical Papers.

* cited by examiner

*Primary Examiner*—Jey Tsai
(74) *Attorney, Agent, or Firm*—Schiff Hardin & Waite

(57) ABSTRACT

A memory cell contains at least one transistor and one capacitor connected to an upper bit line. The capacitor contains a first capacitor electrode arranged above the transistor, and is connected to the transistor. The upper bit line can be created in self-adjusted fashion on the basis of trenches which are of different widths, which extend transversely to one another, and which are arranged between the first capacitor electrodes. At least a part of each first capacitor electrode can be created from a layer which is structured by the trenches. Trenches can be narrowed by spacers.

4 Claims, 3 Drawing Sheets

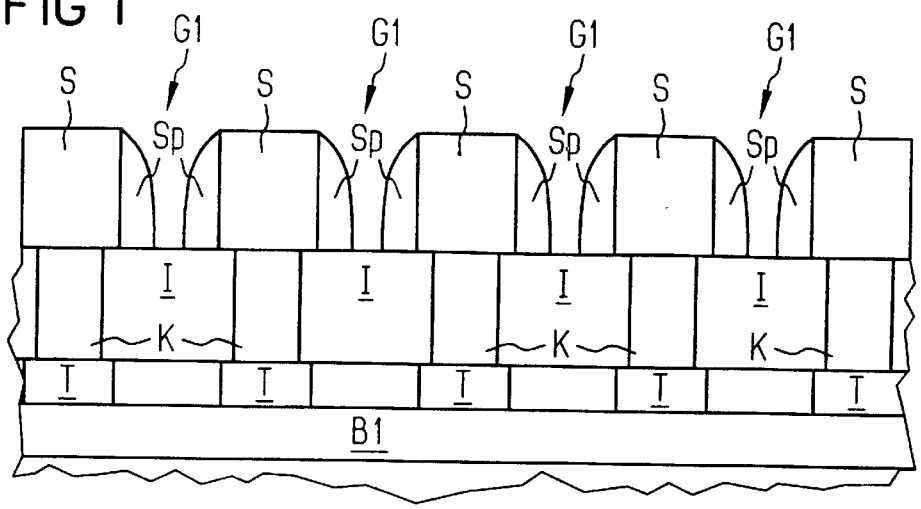
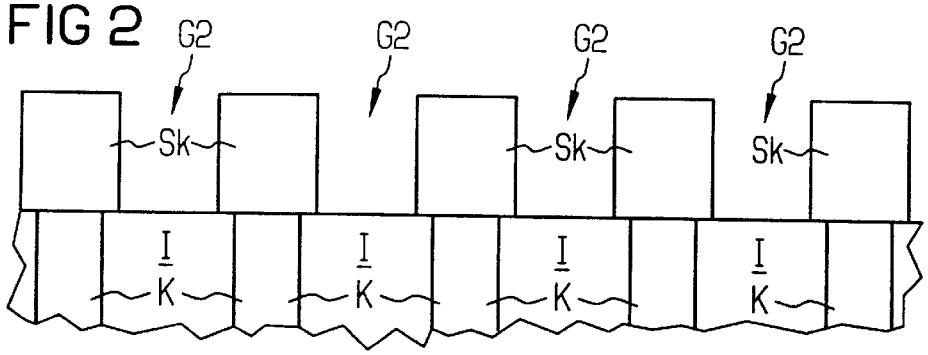
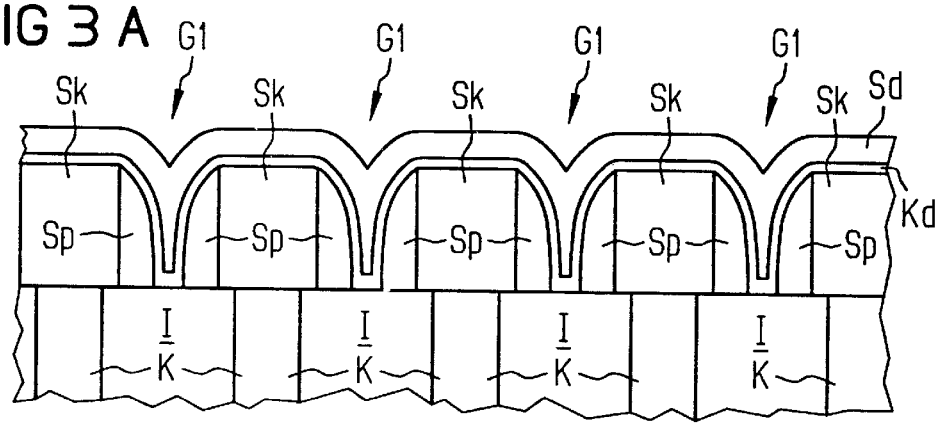

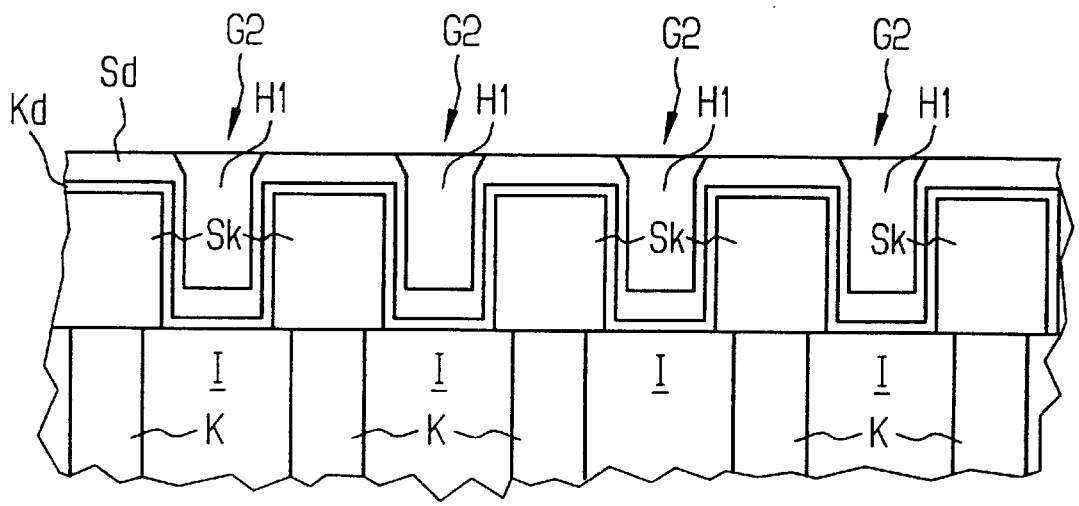
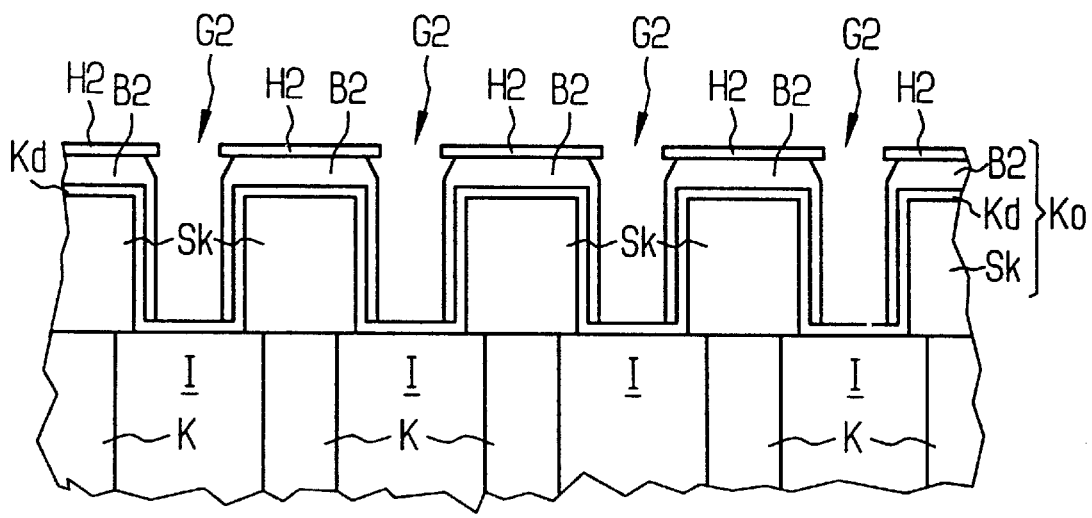

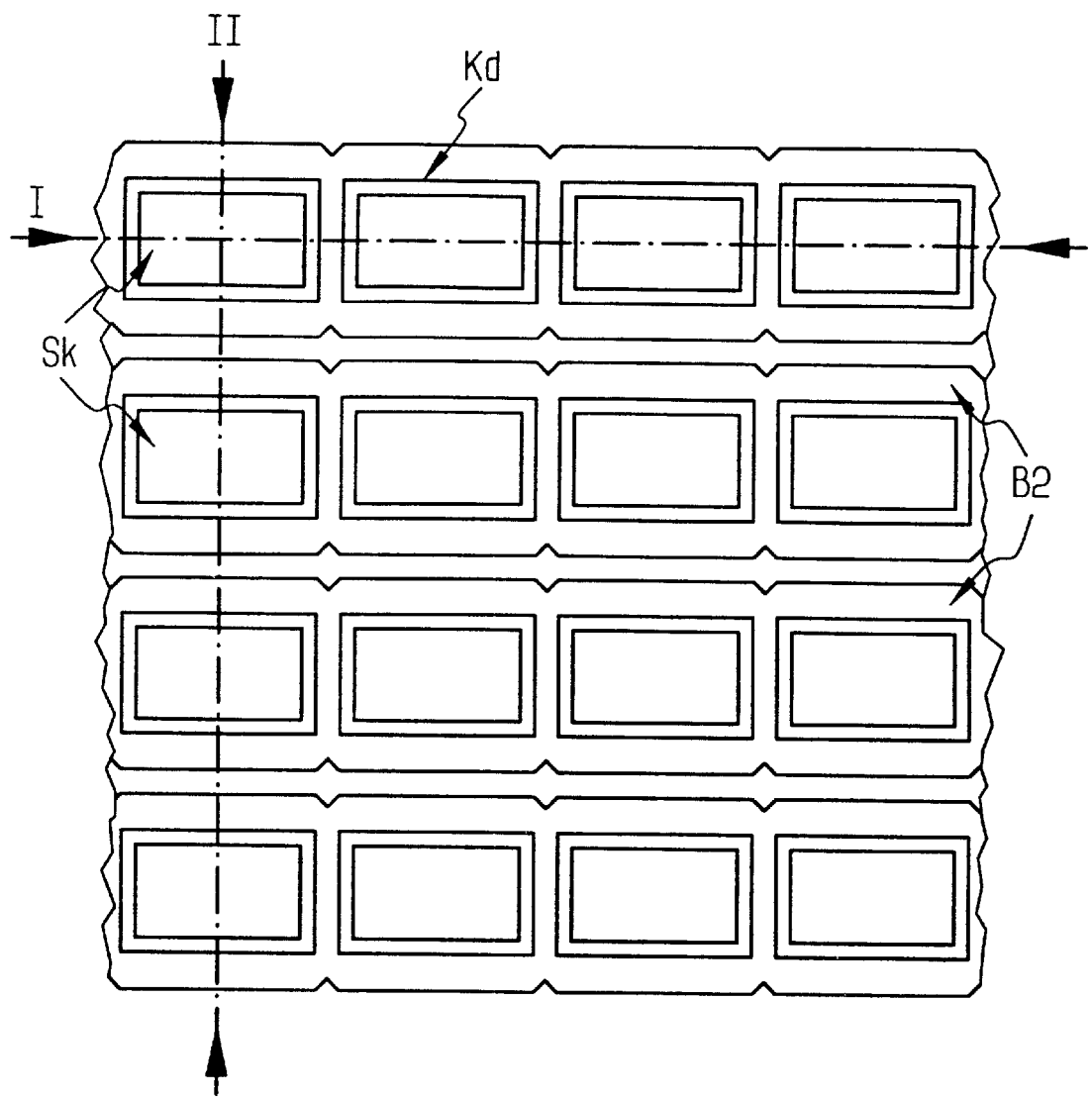

METHOD FOR DRAM CELL ARRANGEMENT AND METHOD FOR ITS PRODUCTION

This is a division of application Ser. No. 09/228,611, filed Jan. 12, 1999.

BACKGROUND OF THE INVENTION

The invention relates to a DRAM cell arrangement, i.e. a memory cell arrangement with dynamic random access, and to a method for its production.

The development of DRAM cell arrangements is focused on increasing the packing density. Currently, in DRAM arrangements, what are known as single-transistor memory cells are employed almost exclusively. A single-transistor memory cell contains a transistor and a capacitor. The information is stored in the capacitor in the form of an electrical charge representing a logical quantity of 0 or 1. By the actuation of the transistor via a word line, this information can be read out via a bit line. The transistor is usually connected between the bit line and the capacitor (for example, see DE 195 19 160). In the readout of the information, the charge on a first capacitor electrode of the capacitor, which electrode is connected to the transistor, determines the voltage at the bit line. A second capacitor electrode, which is not connected to the transistor, is kept constantly at half the operating voltage. A voltage signal which is formed by the difference of the voltage at the bit line and half the operating voltage corresponds to the information. The charge at the second capacitor electrode remains unused.

U.S. Pat. No. 4,630,088 incorporated herein teaches a DRAM cell arrangement in which a capacitor is connected between a bit line and a transistor. The charge of a capacitor electrode which is connected to the bit line is utilized for the formation of a voltage signal to which the information corresponds.

In T. Inaba, et al, "250 mV Bit-Line Swing Scheme for a 1V 4 Gb DRAM," 1995 *Symposium on VLSI Circuits Digest of Technical Papers:* pp 99–100, a DRAM cell arrangement is proposed in which a transistor is connected to a first bit line and a capacitor is connected to a second bit line. A voltage signal to which the information corresponds is generated by the difference of the voltages of the two bit lines, and so in effect by the charges on the two capacitor electrodes. In the charging of the capacitors, the operating voltage is applied either at the first bit line or at the second bit line. At the respective other bit line, 0V is applied. The second bit line is arranged in a depression and serves as a capacitor electrode. The first bit line and the second bit line extend parallel to one another. Due to the utilization of both charges of the capacitor instead of one charge, and due to the described actuation of the bit lines in the charging of the capacitor, for the same strength of the voltage signal, a smaller operating voltage is necessary here than in the DRAM cell arrangements with only one bit line. A smaller operating voltage means less lost power and enables a higher packing density of the DRAM cell arrangement.

The patents DE 195 19 160 and DE 196 37 389 teach the creation of word lines of a DRAM cell arrangement in self-adjusted fashion, i.e. without the utilization of adjusting masks. For this purpose, parallel first trenches are created, which are narrowed by the depositing and etchback of material. Perpendicular to the first trenches, second trenches are created whose width conforms to the original width of the first trenches. The narrowed first trenches are accordingly narrower than the second trenches. Material is deposited and etched back to create the word lines, whereby word lines emerge, in self-adjusted fashion, which extend parallel to the second trenches and which surround transistors in annular fashion.

In Y. Nishioka et al, "Giga-Bit Scale DRAM Cell with New Simple Ru/(Ba, Sr)TiO$_3$/Ru Stacked Capacitors Using X-Ray Lithography", *IEDM* 95: p. 903, a DRAM cell arrangement is described in which a transistor is connected between a capacitor and a bit line. The capacitor is arranged over the transistor. Separate capacitor electrodes are provided with a capacitor dielectric, at which a capacitor plate adjoins.

SUMMARY OF THE INVENTION

It is an object of the invention to propose a DRAM arrangement which can be produced with the packing density necessary for the 1 GBit generation. Furthermore, a method for the production of such a DRAM cell arrangement is proposed.

According to the invention, a DRAM cell arrangement and method for making the arrangement is provided wherein a capacitor has a first capacitor electrode, and edges of the first capacitor electrode have a capacitor dielectric. An upper bit line is connected to the capacitor and acts as a second capacitor electrode and which annularly surrounds the first capacitor electrode having the capacitor dielectric. A transistor is arranged beneath the capacitor and is connected to the first capacitor electrode. First trenches are arranged between neighboring first capacitor electrodes along the upper bit line and which are narrower than second trenches arranged between neighboring first capacitor electrodes situated transversely to the upper bit line.

In the DRAM cell arrangement of the invention, an upper bit line is arranged above the capacitor, and the capacitor is arranged above a transistor. Sides of a first electrode of the capacitor, which electrode is connected to the transistor, are provided with a capacitor dielectric. The upper bit line is adjacent at the capacitor dielectric and surrounds the first capacitor electrode in annular fashion. The upper bit line also serves as a second capacitor electrode. In the readout of a stored item of information, a charge on the second capacitor electrode generates a voltage signal to which the item of information corresponds.

It is advantageous if an additional lower bit line is provided. The transistor is then connected between the first capacitor electrode and the lower bit line. The upper bit line extends beneath and parallel to the upper bit line. By means of the utilization of two bit lines, a smaller operating voltage can be utilized, as mentioned above. Instead of reducing the operating voltage, the voltage signal can be enlarged. Furthermore, both the operating voltage can be decreased and the voltage signal can be enlarged.

If the lower bit line is forgone, a source/drain region of the transistor can be connected to a constant potential, which usually equals half the operating voltage.

Parallel first trenches are provided and second trenches which extend transversely to the first trenches are provided, which separate neighboring first capacitor electrodes and in which upper bit lines of the DRAM cell arrangement are arranged. The first trenches are arranged between first capacitor electrodes which are arranged in adjacent fashion along the upper bit line. The first trenches thus extend transversely to the upper bit line. The second trenches are arranged between first capacitor electrodes which are situated in adjacent fashion transversely to the upper bit line. The second trenches thus extend substantially parallel to the upper bit line.

The first trenches are narrower than the second trenches. The DRAM cell arrangement can be produced with a small processing expense compared to the prior art, while simultaneously achieving a higher packing density. Subsequent to the creation of the capacitor dielectric, an upper bit line is created in self-adjusted fashion in that material is deposited and etched. The thickness of the deposited material is such that it fills the first trenches but not the second trenches. It is etched until the bottom of every second trench is partially exposed. The upper bit line thus arises in self-adjusted fashion and parallel to the second trenches. It surrounds the first capacitor electrode in annular fashion. The self-adjusted creation is a procedural simplification, for one, since no lithographically structured masks are created. On the other hand, it enables an increase of the packing density, since the necessary consideration of justification tolerances, which follows from the utilization of masks, is forgone.

To create the first capacitor electrodes, a layer can first be created. The layer is structured by the first trenches and the second trenches. The first trenches and the second trenches split the layer. The separate first capacitor electrodes emerge from the structured layer.

It lies within the framework of the invention to narrow the first trenches in the course of the method. In this case, the first trenches can be initially created with the width of the second trenches, for example, and can then be narrowed. Such a method is particularly advantageous for achieving a high packing density, since the first trenches and the second trenches are initially created with a width which corresponds to the minimal structural size that can be produced with the utilized technology.

The narrowing of the first trenches can be achieved in that, prior to the creation of the second trenches, the first trenches are narrowed since material is deposited and etched back until spacers emerge at edges of the first trenches. The spacers are preferably created from the same material as from the material of the layer.

If the spacers are constructed of conductive material, then they act as parts of the first capacitor electrodes. In this case, distances between neighboring first capacitor electrodes along the upper bit line are smaller than distances between neighboring first capacitor electrodes that are situated transversely to the upper bit line.

If the spacers are formed of non-conductive material, then they do not act as parts of the first capacitor electrodes.

To achieve a high packing density, it is advantageous if distances between center lines of neighboring first trenches and distances between center lines of neighboring second trenches are the same, and if they correspond to the minimal structural size that can be produced in the utilized technology. Distances between midpoints of neighboring first capacitor electrodes along the upper bit line are then the same as distances between midpoints of neighboring first capacitor electrodes situated transversely to the upper bit line.

To increase the capacitance of the capacitor, it is advantageous if the upper bit line covers the first capacitor electrode. For this purpose, for example, following the creation of the capacitor dielectric, a first material is deposited until the first trenches are full, but not the second trenches. The second trenches are subsequently filled by the depositing of a second material. By the etchback of the second material, parts of the first material located outside the second trenches, and parts of the first material located in the region of the edges or sides of the second trenches, are exposed. Thermal oxidation produces auxiliary structures at the exposed parts of the first material. The second material is subsequently removed since it is selectively etched to the auxiliary structures. By anisotropic etching of the first material selectively to the auxiliary structures, the upper bit lines emerge from the first material, said bit lines covering the first capacitor electrodes in the etching, on the basis of the protective effect of the auxiliary structures. The auxiliary structures act as masks which are created without lithography, i.e. in self-adjusted fashion with respect to the first capacitor electrodes.

It lies within the framework of the invention to create the auxiliary structures from parts of the first material by other methods. What is important is that the first material can be removed selectively with respect to the auxiliary structures.

To increase the packing density, it is advantageous if the transistor is a vertical transistor.

The invention is detailed below with the aid of an exemplifying embodiment, which is depicted in the Figures.

BRIEF DESCRIPTION OF THE DRAWINGS

FIG. 1 depicts a cross-section through a layer which has been deposited onto an insulating structure with contacts, subsequent to the creation of first trenches and spacers. A lower bit line and positions of transistors are schematically depicted in this figure. The lower bit line and the positions of the transistors are not depicted in the figures that follow.

FIG. 2 depicts a cross-section through the layer, perpendicular to the cross-section of FIG. 1, subsequent to the creation of the second trenches and subsequent to the creation first capacitor electrodes from the layer.

FIG. 3a depicts the cross-section from FIG. 1, subsequent to the steps from FIG. 2 and subsequent to the creation of a capacitor dielectric, a thin layer and a first auxiliary structure.

FIG. 3b depicts the cross-section from FIG. 2, subsequent to the steps from FIG. 3a.

FIG. 4 depicts the cross-section from FIG. 3b, subsequent to the creation of a second auxiliary structure, the removal of the first auxiliary structure, and the creation of upper bit line.

FIG. 5 depicts a cross-section through the layer, perpendicular to the cross-sections from FIG. 3a and FIG. 3b, subsequent to the steps from FIG. 4.

DESCRIPTION OF THE PREFERRED EMBODIMENTS

The drawing Figures described hereafter are not to scale.

In the exemplifying embodiment, transistors T, which are connected to lower bit lines B1, are created. Word lines (not depicted) which extend transversely to the lower bit lines B1 are connected to gate electrodes of the transistors T. An insulating structure I is created over the transistors T, the lower bit lines B1 and the word lines. Contacts K are created in the insulating structure I, said contacts being respectively connected to one of the transistors T. Ruthenium is deposited in a thickness of about 400 nm to create a layer S (see FIG. 1). Etching with e.g. $CCl_2F_2$, $O_2$, Ar creates parallel first trenches G1 in the layer S (FIG. 1), which split the layer S. The first trenches G1 are about 200 nm wide. Distances between center lines of neighboring first trenches G1 equal about 200 nm. To narrow the first trenches G1, Ruthenium is deposited in a thickness of ca. 50 nm and is etched back with e.g. $CCl_2F_2$, $O_2$, Ar until spacers Sp arise at the edges of the first trenches G1 (FIG. 1).

Second trenches G2, which extend perpendicular to the first trenches G1 and which split the layer S, are etched by masked etching with e.g. $CCl_2F_2$, $O_2$, Ar (FIG. 2). Essentially cuboidal first capacitor electrodes Sk thereby emerge from the layer S and from the spacers Sp. The first capacitor electrodes Sk are connected to the transistors T via the contacts K.

To create a capacitor dielectric Kd, BST (Barium strontium titanate) is deposited in a thickness of about 10 nm, for example (FIG. 3a and 3b). The capacitor dielectric Kd covers edges and an upper side of the first capacitor electrodes Sk. To create a thin layer Sd, polysilicon doped in situ is deposited in a thickness of ca. 50 nm. The thin layer Sd fills the first trenches G1 (FIG. 3a), but not the second trenches G2 (FIG. 3b). Capacitors $K_o$ are respectively formed by one of the first capacitor electrodes Sk, a part of the capacitor dielectric Kd, and a part of the thin layer Sd.

To create strip-shaped first auxiliary structures H1, silicon nitride is deposited in a thickness of about 100 nm, is planarized by chemical mechanical polishing, and is subsequently etched until the thin layer Sd is partially exposed. The thin layer Sd is exposed outside the second trenches G2 and in the region of the edges of the second trenches G2. The second trenches G2 are filled by the first auxiliary structures H1 (FIG. 3b).

A second auxiliary structure H2, which is formed Of $SiO_2$, is created from upper parts of the exposed parts of the thin layer Sd by thermal oxidation (FIG. 4). Silicon nitride is subsequently selectively etched to $SiO_2$, with $H_3PO_4$ for example, until the first auxiliary structures H1 are removed. Parts of the thin layer Sd inside the second trenches G2 are thereby exposed. The thin layer Sd is partially removed by the etching of polysilicon selectively to $SiO_2$, with He, HBr, $Cl_2$, $C_2F_6$, for example, until parts of the capacitor dielectric Kd located inside the second trenches G2 are exposed. This results in the emergence, from the thin layer Sd, of upper bit lines B2, which extend parallel to the second trenches G2 and which surround, in annular fashion, and cover the first capacitor electrodes Sk, which are provided with the capacitor dielectric (FIGS. 4 and 5). The upper bit lines B2 serve partially as second capacitor electrodes, which are part of the capacitors $K_o$.

There are many conceivable variations of the exemplifying embodiment which also lie in the framework of the invention. In particular, the dimensioning of the described layers, trenches, and structures can be adapted to the respective requirements.

Polysilicon can be doped either during or after the depositing.

Instead of doped polysilicon, other conductive materials can be used for the thin layer, such as metal silicides and/or metals. The materials can be chemically transformed by oxidation or by the depositing of a suitable layer, so that the second auxiliary structures can be created.

Instead of ruthenium, other conductive materials can be utilized or the first capacitor electrodes; for example, metal nitrides such as titanium nitride, semiconductor materials, metals such as tungsten, or metal silicides.

The lower bit lines can be forgone.

Although various minor modifications might be suggested by those skilled in the art, it should be understood that our wish to embody within the scope of the patent warranted hereon all such modifications as reasonably and properly come with the scope of our contribution to the art.

We claim as our invention:

1. A method for producing a DRAM cell arrangement, comprising the steps of:
   creating as part of a capacitor a first capacitor electrode above a transistor such that it is connected to the transistor;
   providing edges of the first capacitor electrode with a capacitor dielectric;
   creating an upper bit line connected to the capacitor and which annularly surrounds the first capacitor electrode provided with the capacitor dielectric;
   creating substantially parallel first trenches;
   creating second trenches substantially parallel and which extend transversely to the first trenches;
   making the first trenches and the second trenches such that the first trenches are narrower than the second trenches; and
   creating the upper bit lines which extend parallel to the second trenches in self-adjusted fashion by depositing and anisotropic etching of material.

2. The method according to claim 1, including the steps of:
   creating the first trenches between neighboring first capacitor electrodes to be created along the upper bit line to be created;
   creating the first trenches in a first layer such that they split the layer;
   depositing and etching back material so that spacers arise which narrow the first trenches;
   creating the second trenches between neighboring first capacitor electrodes to be created transversely to the bit line to be created;
   creating the second trenches in the layer such that they split the layer and are wider than the first trenches which are narrowed by the spacers;
   creating at least a part of each first capacitor electrode from the layer which is structured by the creation of the first trenches and of the second trenches;
   creating the capacitor dielectric; and
   creating the upper bit line in self-adjusted fashion by depositing material in such a thickness that the first trenches are filled, but not the second trenches, and then exposing parts of the capacitor dielectric located in the second trenches by anisotropic etching of the material whereby the upper bit line extends parallel to the second trenches.

3. The method according to claim 2, including the further steps of:
   subsequent to the creation of the capacitor dielectric, depositing a first material to fill the first trenches, but not the second trenches;
   depositing a second material filling the second trenches with first auxiliary structures;
   etching the second material until the first material is partially exposed outside the second trenches and in the region of the edges of the second trenches;
   creating second auxiliary structures from parts of the exposed parts of the first material;
   removing the first auxiliary structures; and
   selectively etching the first material to the second auxiliary structures until separate upper bit lines are created.

4. A method for producing a DRAM cell arrangement, comprising the steps of:
   creating as part of a capacitor a first capacitor electrode above a transistor such that it is connected to the transistor;
   providing the first capacitor electrode with a capacitor dielectric;
   creating an upper bit line connected to the capacitor;
   creating substantially parallel first trenches;
   creating second trenches substantially parallel and which extend transversely to the first trenches;
   making the first trenches and the second trenches such that the first trenches are narrower than the second trenches; and
   creating the upper bit lines which extend parallel to the second trenches in self-adjusted fashion by depositing and anisotropic etching of material.

* * * * *